United States Patent [19]

Stipanuk

[11] 4,100,431
[45] Jul. 11, 1978

[54] INTEGRATED INJECTION LOGIC TO LINEAR HIGH IMPEDANCE CURRENT INTERFACE

[75] Inventor: James Jacob Stipanuk, Mesa, Ariz.
[73] Assignee: Motorola, Inc., Schaumburg, Ill.
[21] Appl. No.: 730,415
[22] Filed: Oct. 7, 1976
[51] Int. Cl.$^2$ .................. H03K 19/08; H03F 31/4; H02J 1/04; H03F 3/45
[52] U.S. Cl. ................... 307/213; 307/297; 307/299 B; 307/DIG. 1; 330/257; 330/307; 357/92
[58] Field of Search ........... 307/213, 297, 255, 299 B, 307/313, DIG. 1; 357/92; 330/252, 257, 258, 307

[56] References Cited
U.S. PATENT DOCUMENTS 3,872,323  3/1975  Frederiksen ............... 307/299 B X
4,009,397  2/1977  Mulder et al. ............. 307/213 X

OTHER PUBLICATIONS

Hart et al., "Bipolar LSI Takes a New Direction with Integrated Injection Logic," Electronics (pub.), pp. 111-118; Oct. 3, 1974.
Berger et al., "MTL-A Low-Cost Bipolar Logic Concept," IEEE Journ. of Solid-State Circuits, pp. 340-346, vol. SC-7; No. 5, Oct. 1972.
Jaeger, "Regulated Power Supply for MTL Integrated Circuits," IBM Tech. Discl. Bull., vol. 18, No. 4, pp. 1220-1222; Sep. 1975.
Mulder et al., "High Speed Integrated Injection Logic (I$^2$L)," IEEE Journ. of Solid-State Circuits, pp. 379-385; vol. SC-11, No. 3, Jun. 1976.

Primary Examiner—Larry N. Anagnos
Attorney, Agent, or Firm—Robert D. Lott

[57] ABSTRACT

An interface circuit for interconnecting an integrated injection logic (I$^2$L) portion of an integrated circuit to a linear portion of an integrated circuit. The circuit transfers both logic information and I$^2$L current level references from the I$^2$L circuitry to the linear circuitry at the relatively large voltage levels present in linear circuitry. One embodiment employs a cascode arrangement involving one transistor, two diodes and a resistor. Another embodiment utilizes the matching characteristics of a pair of transistors operating in the forward and reverse modes respectively to perform the function with only one transistor.

6 Claims, 5 Drawing Figures

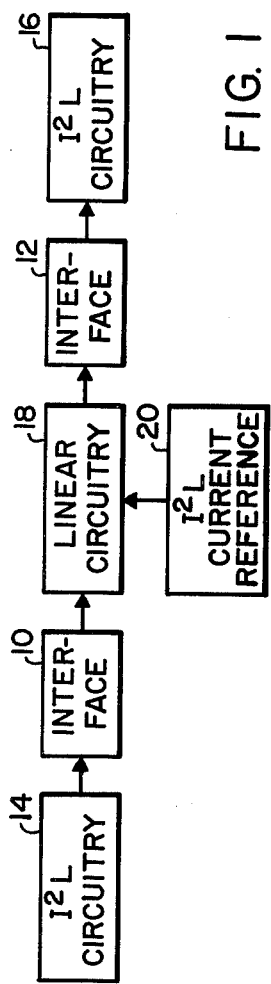
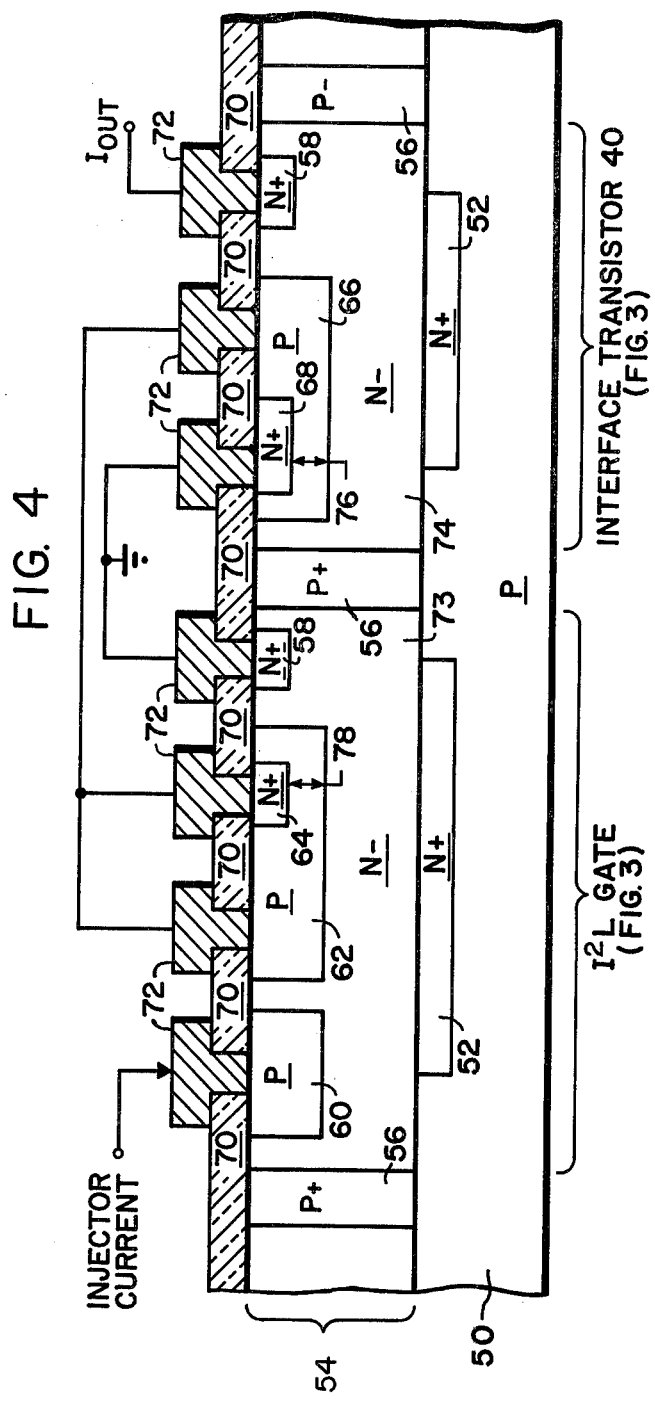

INTEGRATED INJECTION LOGIC TO LINEAR HIGH IMPEDANCE CURRENT INTERFACE

BACKGROUND OF THE INVENTION

This invention relates to the field of electronics where two types, or families, or electronic circuits must be interconnected. More particularly, integrated injection logic (I²L) circuitry and linear circuitry. An example of such a situation would be an integrated circuit digital data processing system controlling an integrated circuit oscillator.

Various families of electronic circuits have been developed within recent years; within each one of these families the circuit elements themselves are compatible with each other. However, the occasion often arises where two families need to be interconnected with each other. Sometimes this interconnection can be done directly, but at other times some sort of interfacing is required to make the two families compatible with each other.

Of the families of circuitry one of the newest is integrated injection logic. Integrated injection logic is a digital logic family which has characteristics of low current and high packing density on integrated circuit chips. A discussion of I²L circuitry and presently known interfacing circuits can be found in Electronics Magazine, Oct. 3, 1974, p. 111. Electronics is published by McGraw Hill, New York, New York, and the issue is Volume 48, No. 3.

One of the problems with prior art interface circuitry is that only logic functions are capable of being transferred by the interface circuit. However for many integrated circuit applications the interface circuit must be able to supply relative large amounts of current to compensate for manufacturing variations. This is not obtainable with prior art circuits without greatly increasing the size and complexity of the interfacing circuitry.

Accordingly it is the object of this invention to achieve interface between an I²L circuit and a linear circuit with the minimum number of components.

It is also the object of the present invention to provide reference current levels of the I²L circuitry; thereby providing compatibility between the two electronic families.

It is another object of this invention to provide I²L current levels from high breakdown, high impedance sources.

SUMMARY OF THE INVENTION

The present invention provides both digital information and current reference information from the I²L circuitry to the output linear circuitry. The result is that now the linear part of the circuitry is referenced to the integrator injection logic part of the circuitry and a minimal number of circuit components to connect the two circuits is required. This is possible since the drive levels of the interface circuitry in the sensitivity levels of the receiving circuitry are matched to each other.

BRIEF DESCRIPTION OF THE DRAWINGS

FIG. 1 is a block diagram of the I²L and linear system showing the interface circuit connecting the I²L to the linear;

FIG. 4 is a cross-sectional view of an integrated circuit which can be used to implement the embodiment illustrated in FIG. 3.

Figure 3:
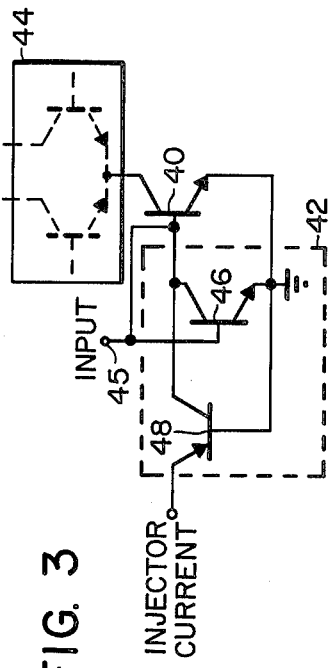
FIG. 3 is a schematic of another embodiment of the invention which employs a single external transistor.

The exemplifications set out herein illustrate the preferred embodiments of the invention in one form thereof, and such exemplifications are not to be construed as limiting in any manner.

DESCRIPTION OF THE PREFERRED EMBODIMENT

Referring first to FIG. 1 interface circuits 10 and 12 are used to interconnect two families of I²L circuitry, 14, 16, with a linear circuit 18. The I²L circuitry 14, 16, and the linear circuitry 18, are conventional circuit types familiar to those skilled in the art. The interface, circuit 12 transfering information from the linear circuitry 18 into the I²L circuitry 16 represents another type of conventional interface not described specifically herein. Interface circuit 10 and I²L current reference circuit 20 are shown in greater detail in FIGS. 2, 3 and 4 and result in the overall advantages of the present invention when employed with a system such as that of FIG. 1 when implemented in integrated circuit form. The I²L current reference 20 is not interfacing directly between I²L circuitry and linear circuitry, but rather is establishing a current reference from circuit 14 and 16, and transferring it to the linear circuitry 18.

Figure 2:
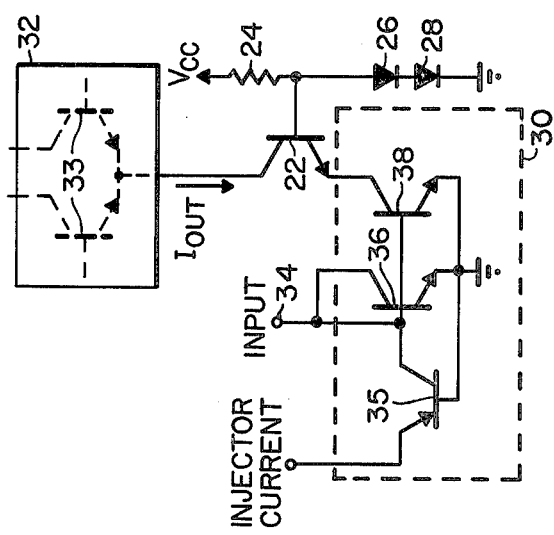
FIG. 2 is a circuit schematic of one embodiment of the invention employing a cascode arrangement.

FIG. 2 is a circuit schematic of one embodiment of the invention. The interface consists of transistor 22, resistor 24 and diodes 26 and 28. The input to the interface circuitry comes from an I²L gate 30 into the emitter of transistor 22. The output of the interface circuitry is through the collector of transistor 22 into the linear circuitry block 32 represented by a pair of transistors 33 shown in phantom. The linear circuitry is of any type common to that family and well known to anyone skilled in the art. I²L gate 30 is a common gate known to anyone skilled in the art. The I²L gate is a common gate of that family with a double collector output, one collector of which is tied back into the input 34, which is also the base of the output transistor. Since the operation of this I²L gate must be understood in conjunction with the operation of the interface circuitry in order to understand the invention, this gate will be described in more detail.

The I²L gate 30 consists of two transistors, a common base transistor 35 receiving the injector current and an output transistor with a double collector but shown in FIG. 2 as two transistors 36, 38 to facilitate the analysis of the circuit. That is transistors 36, 38, share a common base and a common emitter but have separate collector regions. The injector current enters into the emitter of transistor 35 and leaves through the collector of transistor 35. The emitter and collector current are essentially the same since transistor 35 is operating in the grounded base mode. Since transistor 36 and transistor 38 are really the same transistor with two separate collectors, the transfer characteristics of the two transistors are identical and the collector current ($I_c38$) flowing into the collector of transistor 38 is identical to the collector current ($I_c36$) flowing into the collector of transistor 36. Since both transistors must share the same base current ($I_b$), the collector current for each transistor is given by the equation:

$$I_c36 = I_c38 = \beta I_b/2$$

where $\beta$ is the gain of each transistor. Also, since collector current of transistor 36 is being drawn from the base of the transistor, the net base current flowing into transistor 36 and 38 is equal to the collector current ($I_c35$) of transistor 35 minus the collector current of transistor 36. That is $I_b = I_c35 - I_c36$. Combining these relationships, the transfer function of transistor 36 and 38, which is the collector current of transistor 38 divided by the collector current of transistor 35 becomes $I_c38/I_c35 = \beta/(\beta+2)$. Since transistor 35 is operating in the common base mode, the collector current of transistor 35 is equal essentially to the injector current, and therefore the collector current of transistor 38 is then equal approximately to the injector current.

Turning now to the interface circuitry itself of FIG. 2, resistor 24 supplies current to bias the diodes 26 and 28 into their forward conduction mode and thus forms a biasing circuit. The voltages across their two diodes then set a reference potential for the base of transistor 22. Since transistor 22 is biased to operate in this active mode, the collector current of transistor 22 is equal essentially to the emitter current of transistor 22. Therefore the current being drawn from the linear circuitry block 32 is essentially equal to the injection current from the I²L logic circuitry. Transistor 22 is a normal NPN transistor isolated from the I²L gate on the integrated circuit chip. Thus the interface is able to supply the current reference to the injection current and is also able to withstand the high voltages associated with linear circuitry. The interface also provides a high impedance source to the linear circuitry because the collector to base junction of transistor 22 is reverse biased. The diodes 26 and 28 reference the base of transistor 22 and therefore the emitter of transistor 22 to hold the voltage swing across the collector to emitter of transistor 38 at approximately one diode drop. This is important since the I²L output logic gate breakdown voltage between the collector and the emitter is not as great as that of normal NPN transistors. In summary, the interface circuit of FIG. 2 interfaces between the I²L circuitry and the linear circuitry and transfers not only logic information but also current reference information through a high impedance, high breakdown source.

Turning now to the second embodiment of the invention shown in FIG. 3, the interface consists solely of transistor 40 which interfaces between the I²L logic gate 42 and provides transfer to the linear circuitry of block 44. Block 42 is an I²L gate with its output connected to the base of transistor 40 and also connected back into the input 45 of the gate which is also the base of the output transistor, 46. Injector current enters the emitter of transistor 48 and becomes the collector current ($I_c48$) of transistor 48; the two currents being essentially the same since transistor 48 is operating in the common base mode. The collector current ($I_c46$) of transistor 46 is equal to the beta ($\beta$) of the device times the base current $I_b46$ of transistor 46. Since the interface transistor, transistor 40, is a normal NPN transistor with high beta, the base current of this transistor is negligible compared to the collector current of transistor 46. Therefore the base current of transistor 46 is equal to the collector current of transistor 48 minus the collector current of transistor 46: $I_b46 = I_c48 - I_c46$. Since $I_c46$ equals $\beta I_b$, then $I_c46/I_c48 = \beta/(\beta+1)$. In other words, the collector current of transistor 46 is equal approximately to the injector current.

In order to understand the significance of this invention one must understand how the structure of transistor 46 differs from the structure of transistor 40. Transistor 46, which is an output transistor of an I²L gate, is operating in the inverse beta mode as all output transistors of I²L gates operate. The inverse beta mode is described below in conjunction with FIG. 4. Transistor 40 on the other hand is isolated by region 56 (shown in FIG. 4) from transistor 46 and is operating in a normal forward beta mode. However transistors 40 and 46 have the same or proportional geometry and have the same doping levels in their respective base regions. Two transistors which have identical geometries and identical doping levels in their base regions will have the same collector currents if their base to emitter voltage is the same. It is also true that the same transistor will have the same collector current given the same voltage from the base to the emitter no matter if the transistor is operating in the normal forward beta mode or if the transistor is operating in the inverse beta mode. This invention combines these two laws of physics and combines transistor 40 and 46 in the method shown in FIG. 3 to match or proportion the collector current of transistor 40 with the collector current of transistor 46. The result being that the embodiment of FIG. 3 provides a reference current to the linear circuitry which is approximately either the same or proportional to the injector current of the I²L logic. Also transistor 40 operating in the normal forward beta mode is able to withstand the voltages pressed upon it by the linear circuitry. Transistor 40 also provides a high impedance source to the linear circuitry because the collector base junction of transistor 40 is reverse biased. Therefore the embodiment in FIG. 3 also provides a high impedance, high breakdown reference current interface to the linear circuitry from the I²L circuitry.

FIG. 4 is a cross-sectional view of a semiconductor circuitry illustrating one implementation of the circuit of FIG. 3. The structure consists of a basic P type silicon wafer, 50, with N+ buried layers, 52. An N− epitaxial layer, 54, is grown on top of the wafer. Diffused into the epitaxial layer are the isolation regions 56, the preohmic contacts to the N− region which are N+ diffusions, 58, the emitter of the common base transistor of the I²L logic gate (transistor 48 of FIG. 3) which is area 60, the base of I²L output transistor, 46, which is area 62, the collector of I²L output transistor 46 which is area 64, the base of interface transistor 40, area 66, and the emitter of interface transistor 40 area 68. The top of the wafer is covered with silicon dioxide 70 with area etched and metal filled in for the metallic contacts, 72. The I²L gate 42 of FIG. 3 is on the left of the structure in FIG. 4. The emitter of transistor 48 is area 60, the base is area 73 and the collector is area 62 and is the same region as the base of transistor 46. The emitter of transistor 46 is also area 73 in FIG. 4. The collector of transistor 46 is the N+ diffusion area 64. The N+ diffusion, area 58, is the contact to the base of transistor 48 and the emitter of transistor 46. Transistor 40 is represented on the right side of FIG. 4. The collector of transistor 40 is the area 74, the base is area 66, and emitter is the N+ diffusion 68. The N+ diffusion 58 is used as a contact with the collector of transistor 40. Transistor 40 is operating in the normal forward beta mode in that the emitter area 68 is completely surrounded by the base area 66 and the base in turn is set inside the collector area 74. This is a normal transistor geometry which gives rise to normal betas and normal breakdown voltages found in NPN devices. Transistor 46 on the other hand is operating in the inverse beta mode. That is the collector of transistor 46 is area 64, the base is area 62 and the emitter is area 73. The collector is inside the base and the base region is sitting inside the emitter region of the transistor. This inverted structure which allows a high packing density for I²L gates, results in greatly reduced betas and lower breakdown voltages as compared to normal transistor structures.

As is shown in FIG. 4, the I²L gate and interface transistor are located next to each other and the base diffusions for the output transistor 46 and the interface transistor 40 are done in the same manufacturing step. Since the geometry for the two transistor devices is identical, it is possible to match the collector currents of the two devices by applying the same voltage across the base to emitter junction of both devices. Moreover, it is possible by varying the geometry of transistor 40 with respect to transistor 46 to produce a collector current into transistor 40 which is proportional to the collector current of transistor 46. The critical dimensions in FIG. 4 for obtaining this match are the base width of both transistor 40 and transistor 46 shown as dimension 76 and 78 respectively, the base to emitter contact area of transistor 40, and the base to collector contact area of transistor 46. Proportioning the collector current of transistor 40 to the injector current is accomplished by ratioing the base to emitter contact area, of transistor 40 to the base to collector contact area, of transistor 46. For example, if the base to emitter contact area of transistor 40 is twice the base to collector contact area of transistor 46, then the collector current of transistor 40 will be twice that of transistor 46.

The circuit of FIG. 3 has several advantages over the circuit shown in FIG. 2 and is therefor the preferred circuit. The obvious advantage is the fewer number of components to achieve the interface. A second advantage is the fact that in the circuit of FIG. 2, the collector of transistor 22, in order to operate in its active region, must be at least two diode voltage drops above ground. Thus the effective working voltage of the linear portion of the circuitry would be reduced by the voltage drop across these two diodes (approximately 1.4 volts). However in FIG. 3 the collector of transistor 40 need only be at a potential of greater than the base to emitter voltage of the device. Since the base to emitter voltage of transistor 40 is equal approximately to the diode drop of either of the diodes 26 or 28 of FIG. 2, FIG. 3 shows a 2 to 1 improvement. The third advantage is that the circuit in FIG. 2 has a transfer function of $\beta/(\beta+2)$; whereas, the circuit in FIG. 3 has a transfer function of $\beta/(\beta+1)$, making FIG. 3 less susceptible to variations in beta.

Figure 5:
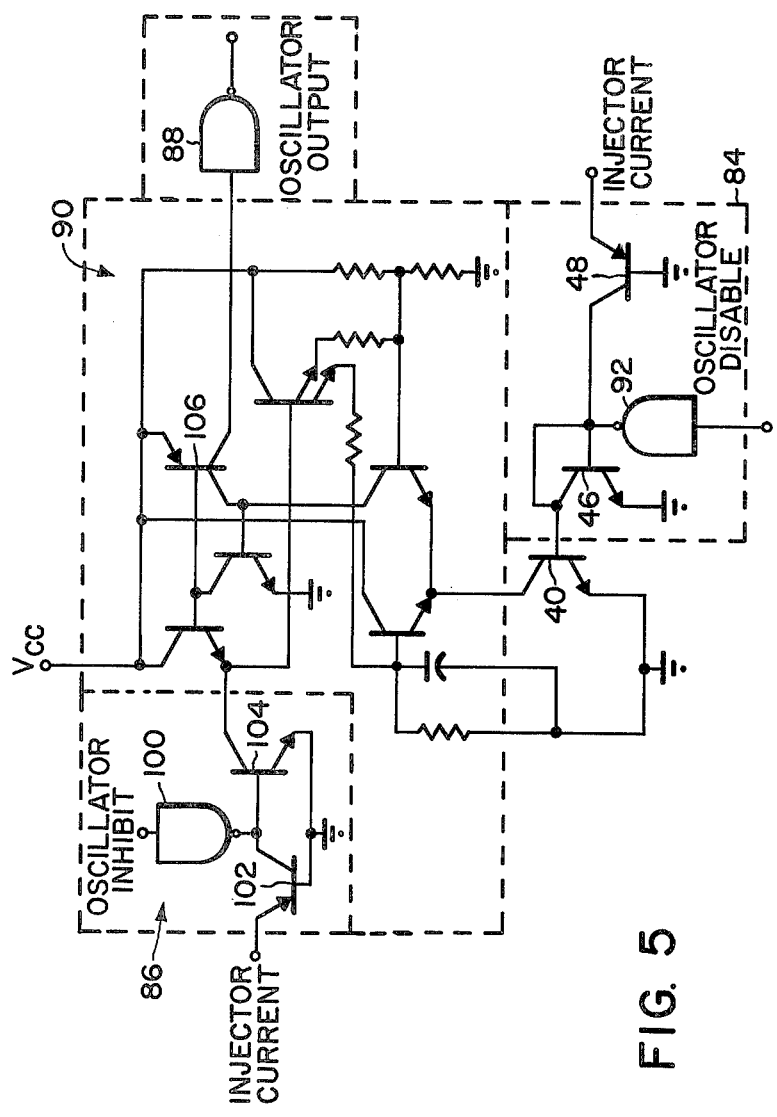
FIG. 5 is a schematic of an electronic circuit illustrating an application of the invention in one form thereof.

FIG. 5 illustrates examples of interfacing I²L logic circuits 84, 86, 88, to a linear circuit 90. In this particular example, linear circuit 90 is a relaxation oscillator. The oscillator disable signal from the I²L circuitry represented by gate 92 is the input into the interface circuitry of FIG. 3. Thus the differential amplifier of the linear circuitry in block 90 is being current controlled by the interface circuitry of transistor 40 which is referenced to the injector current of the I²L logic. It is possible to replace transistors 46, 48 and 40 with the interface circuitry shown in FIG. 2. Note that it would also be possible for the interface circuitry to operate without a control signal in which case it would act as an I²L reference current source for the linear circuitry.

The I²L gate, 100, which supplies the oscillator disable signal, along with transistors 102 and 104 represent conventional or prior means of interfacing. In this instance, the current into the collector of transistor 104 is equal to beta times the base current. The base current is equal to approximately the injector current into transistor 102. Therefore, it will be appreciated that such an interface is highly susceptible to beta variations. This type of interface is possible in this application because the linear circuitry is tied to the I²L current levels through the interface of transistor 40. That is the current levels in the linear circuit are controlled to the extent that the sinking capabilities of transistor 104 will always be large enough to ensure that the oscillator will be inhibited. This interface is also possible since the design prevents the application of the full supply voltage onto the collector of transistor 104.

Another advantage of the invention is illustrated in FIG. 5 in that the linear part of the circuitry which is now referenced to the I²L logic injector current, is now able to interface directly with other I²L logic circuitry represented by block 88. Transistor 106 in the linear circuitry has its current levels controlled by the interface transistor 40 and its collector is able to directly interface with the I²L gate in block 88. The use of the invention in this circuit with its high impedance, high breakdown, and current reference to the I²L injector current has allowed the utilization of less complex means of interface known in the prior art and has allowed direct interface in the output circuitry.

The foregoing description of the embodiment of the invention is by way of example only and not intended to limit the scope of the appended claims. No attempt has been made to illustrate all possible embodiments of the invention but rather only to illustrate its principles in the best manner presently known to practice it. Therefore, such other forms of the invention as may occur to one skilled in the art upon reading of the aforegoing specification are also within the spirit and scope of the invention and it is intended that this invention includes all modifications and equivalents which fall within the scope of the appended claims.

What is claimed is:
1. An integrated circuit comprising:
 (a) an I²L circuit having a predetermined breakdown voltage and including a first output transistor having current level I flowing therethrough,
 (b) a linear circuit adapted to be coupled to a voltage supply, and
 (c) an interface circuit coupled to said first output transistor of said I²L circuit and to said linear circuit, and including means for maintaining said first output transistor out of breakdown and for generating a predetermined current level IA at said linear circuit, where A is a constant.
2. An integrated circuit as in claim 1 further comprising:
 (a) said I²L circuit and interface circuit being disposed on a semiconductor body in order to allow the matching of device characteristics.
3. An integrated circuit as in claim 2 wherein:
 (a) said interface circuit comprises a second transistor coupled to said first output transistor and being operated in a forward mode;
 (b) said first output transistor being operated in a reverse mode, and
 (c) said first output transistor and said second transistor having substantially proportionally dimensioned base regions for generating substantially proportional currents in said first and second transistors.

4. An integrated circuit as in claim 1 wherein said I²L circuit includes:
   (a) means for disabling said interface circuit from transmitting a logic signal to said linear circuit.

5. An integrated circuit as in claim 1 wherein:
   (a) said interface circuit comprises a second transistor the emitter of which is coupled to the collector of said first output transistor and biasing means coupled to the base of said second transistor for maintaining said first transistor out of breakdown.

6. An integrated circuit as in claim 5 wherein:
   (a) said first output transistor comprises multicollector regions, one of said regions being directly coupled to its base terminal, and the other collector region being coupled to the emitter terminal of said second transistor.

* * * * *